United States Patent [19]

Inada et al.

[11] Patent Number: 5,625,433
[45] Date of Patent: Apr. 29, 1997

[54] APPARATUS AND METHOD FOR DEVELOPING RESIST COATED ON A SUBSTRATE

[75] Inventors: Hiroichi Inada; Kunie Tsunematsu, both of Kumamoto, Japan

[73] Assignees: Tokyo Electron Limited, Tokyo; Tokyo Electron Kyushu Limited, Tosu, both of Japan

[21] Appl. No.: 535,895

[22] Filed: Sep. 28, 1995

[30] Foreign Application Priority Data

Sep. 29, 1994 [JP] Japan .................................. 6-259155

[51] Int. Cl.⁶ .............................. G03D 5/00; G03D 3/02
[52] U.S. Cl. ................................. 396/604; 396/627
[58] Field of Search ............................ 354/317, 325, 354/323, 326; 355/43–45, 53, 77; 156/345, 639, 640; 134/1, 3; 428/548

[56] References Cited

U.S. PATENT DOCUMENTS

| | | | |
|---|---|---|---|
| 4,161,356 | 7/1979 | Giffin et al. | 354/323 |
| 4,564,280 | 1/1986 | Fukuda | 354/317 |
| 5,159,374 | 10/1992 | Groshong | 354/317 |
| 5,226,953 | 7/1993 | Hodes et al. | 428/548 |
| 5,376,216 | 12/1994 | Yoshioska et al. | 156/345 |

FOREIGN PATENT DOCUMENTS

| | | | |
|---|---|---|---|
| 2-51229 | 2/1990 | Japan . | |
| 2-37690 | 8/1990 | Japan . | |
| 2-38441 | 10/1990 | Japan | 354/317 |

*Primary Examiner*—D. Rutledge
*Attorney, Agent, or Firm*—Oblon, Spivak, McClelland, Maier & Neustadt, P.C.

[57] ABSTRACT

A developing apparatus comprising a spin chuck for rotating a wafer while keeping the wafer substantially horizontal with a resist-coated surface up, a nozzle for supplying developer, from above and obliquely, to the resist-coated surface of the wafer on the sign chuck, a source for supplying the developer to the nozzle, a cup arranged enclosing a peripheral portion of the wafer on the spin chuck and having a drain passage through which the developer supplied to the wafer is drained, and a belt drive mechanism for moving the nozzle in a horizontal plane to discharge the developer to the wafer in such a direction that follows the wafer rotating.

23 Claims, 11 Drawing Sheets

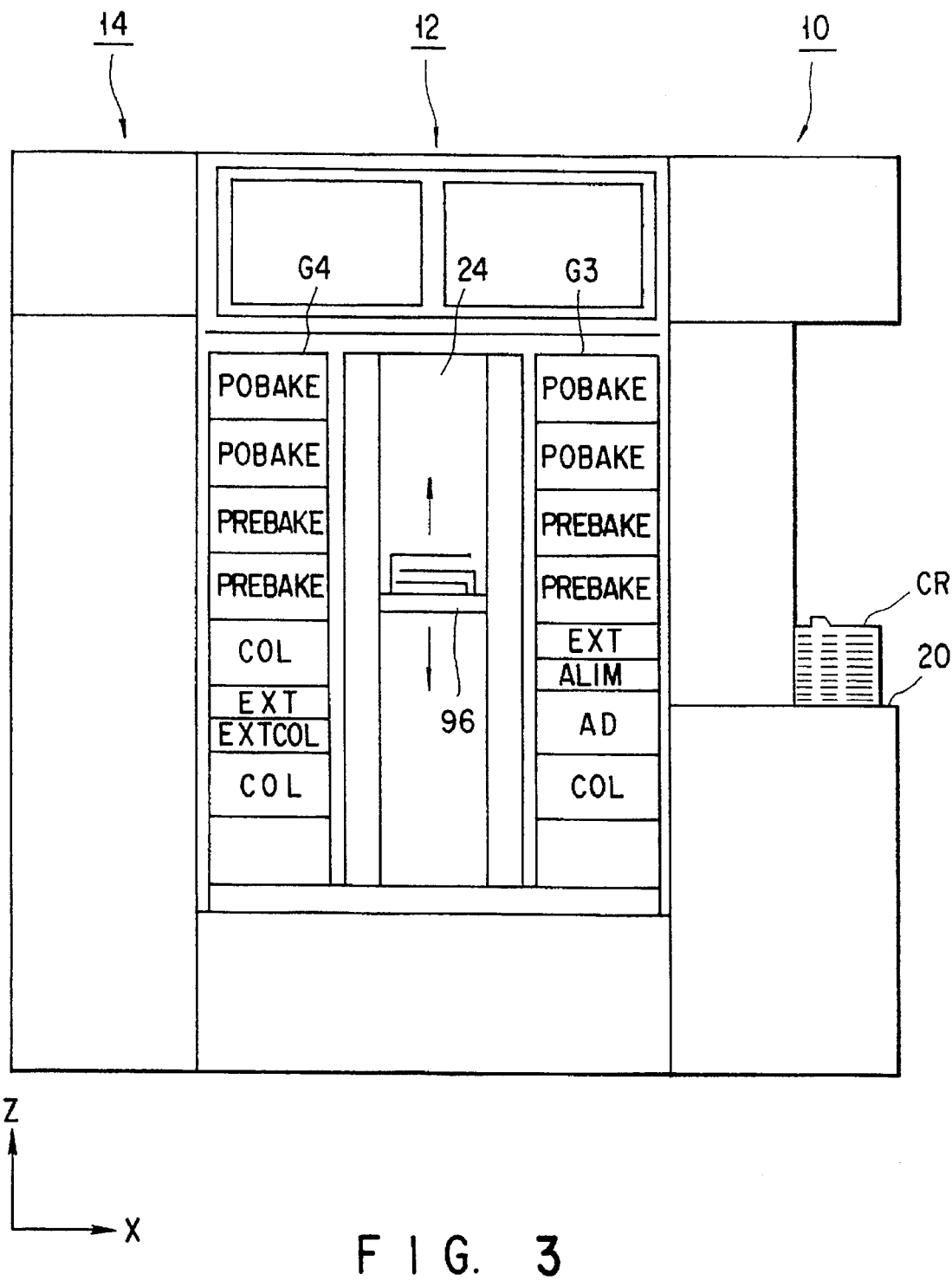
F I G. 3

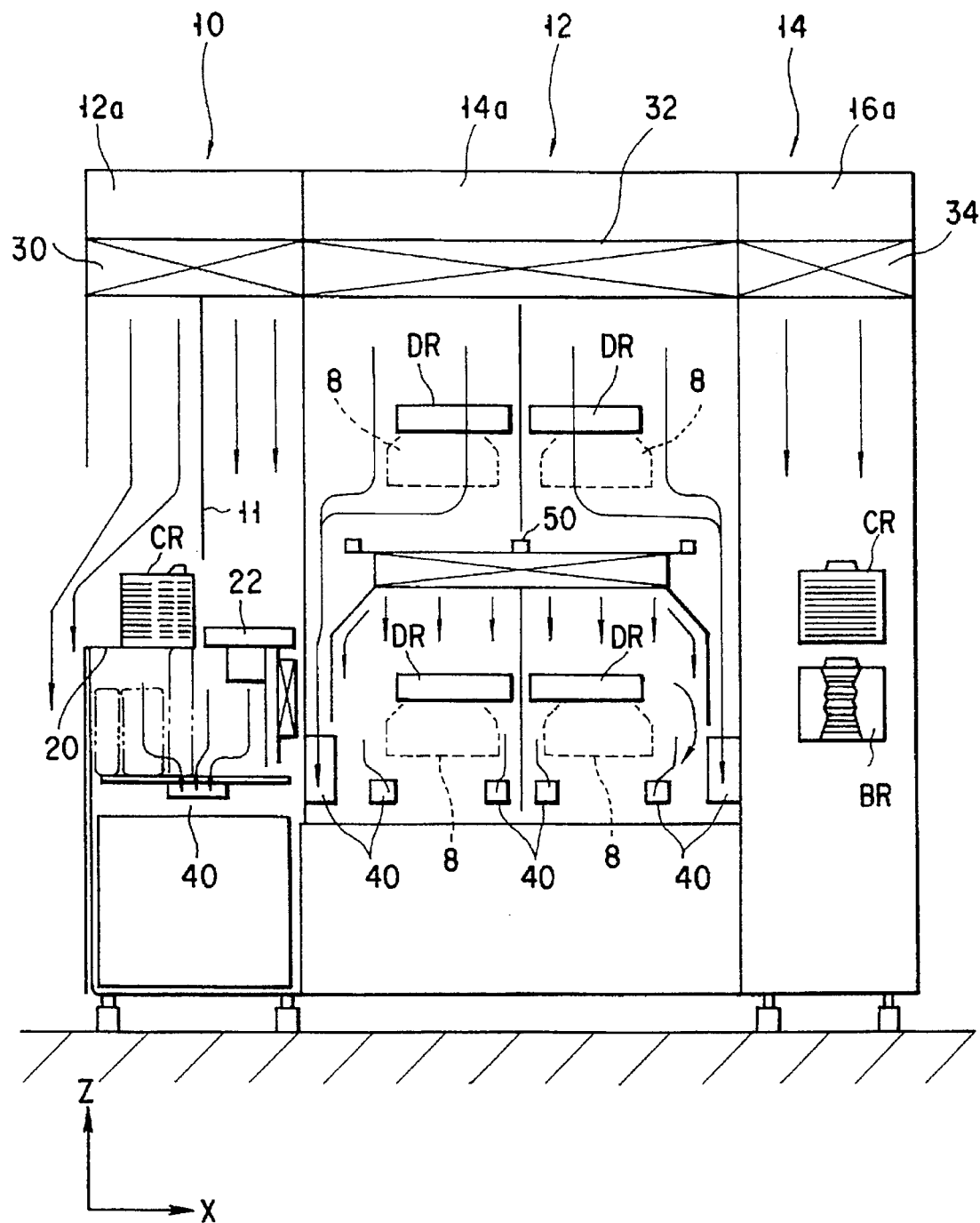
F I G. 4

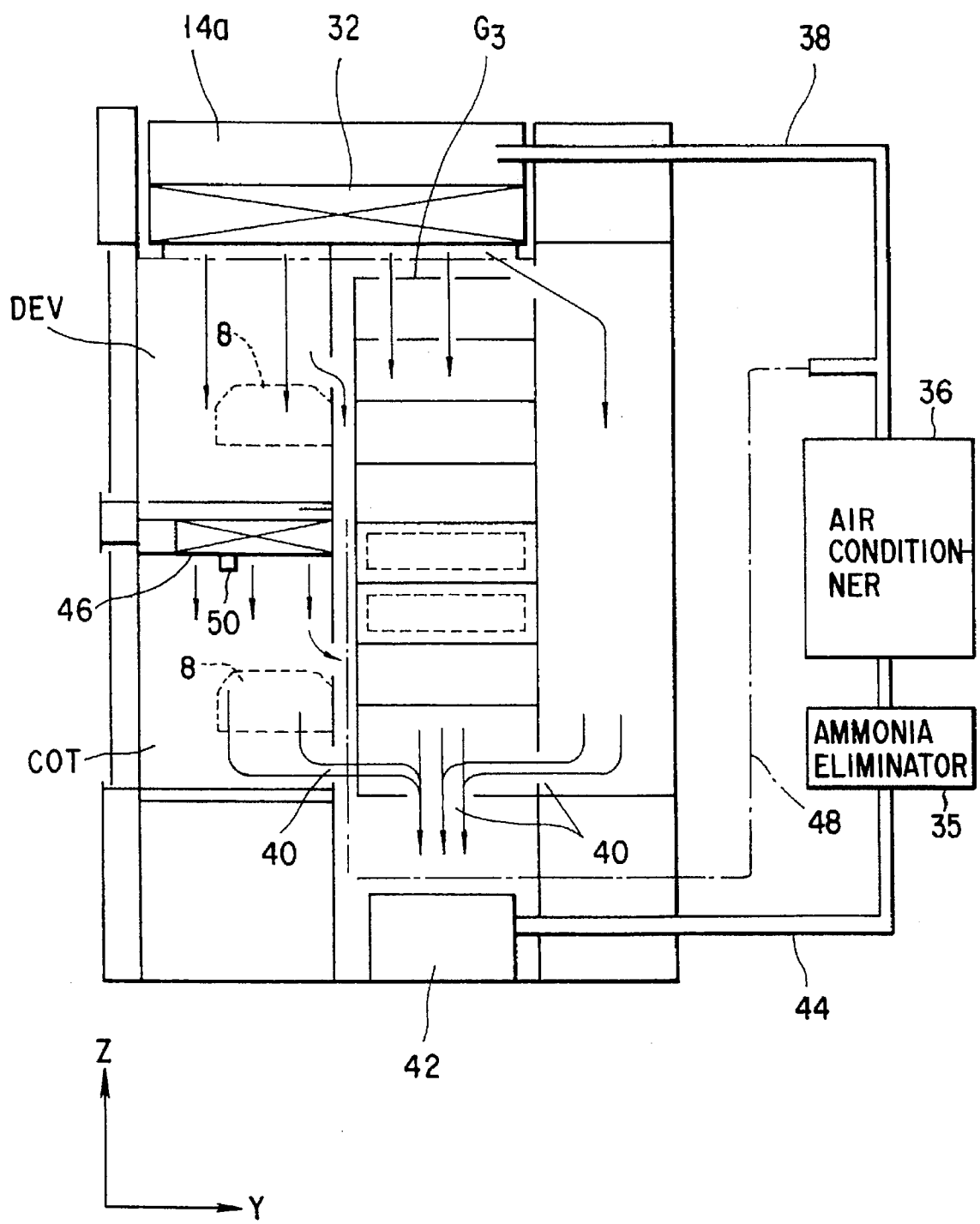
F I G. 5

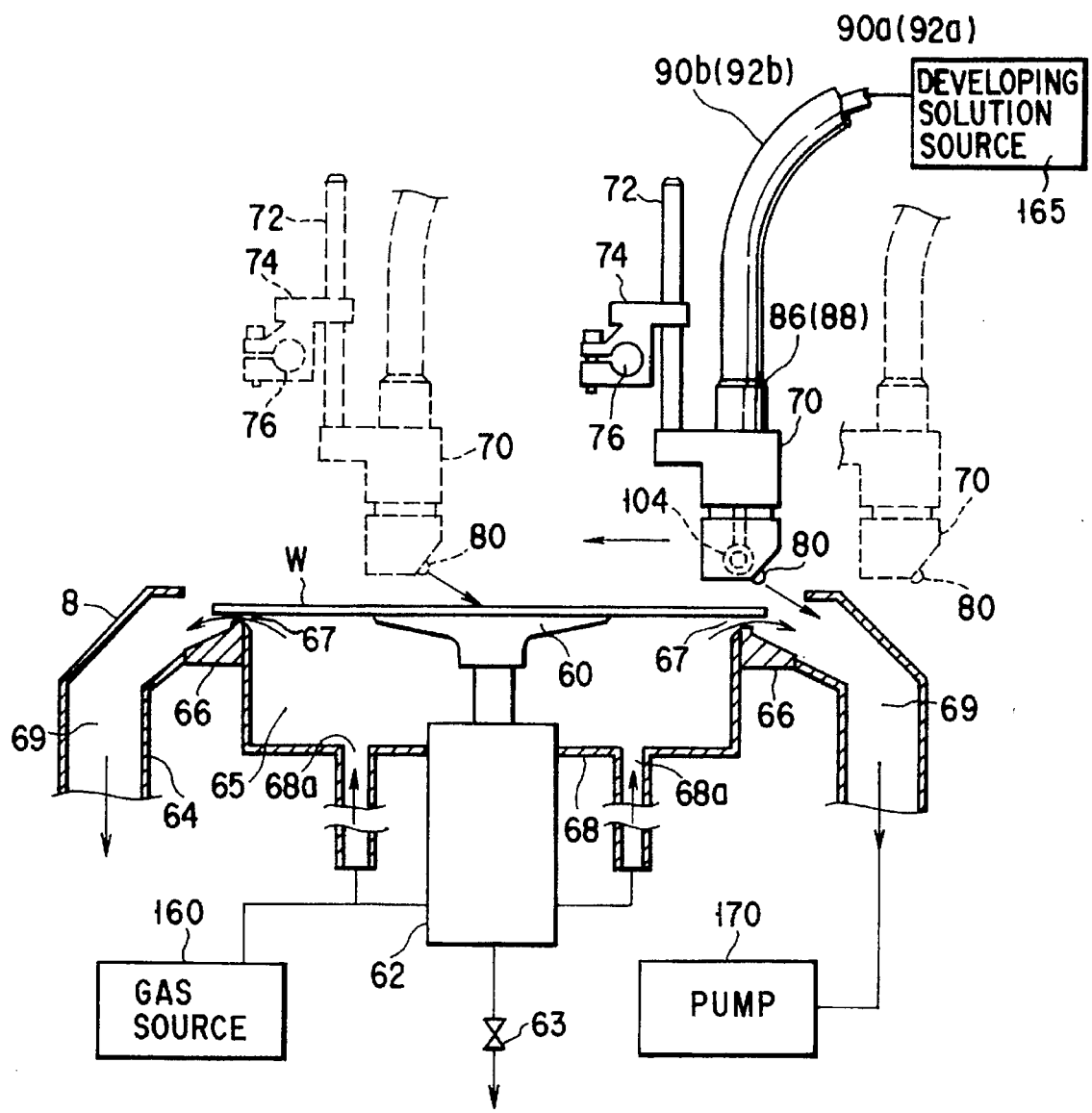
F I G. 6
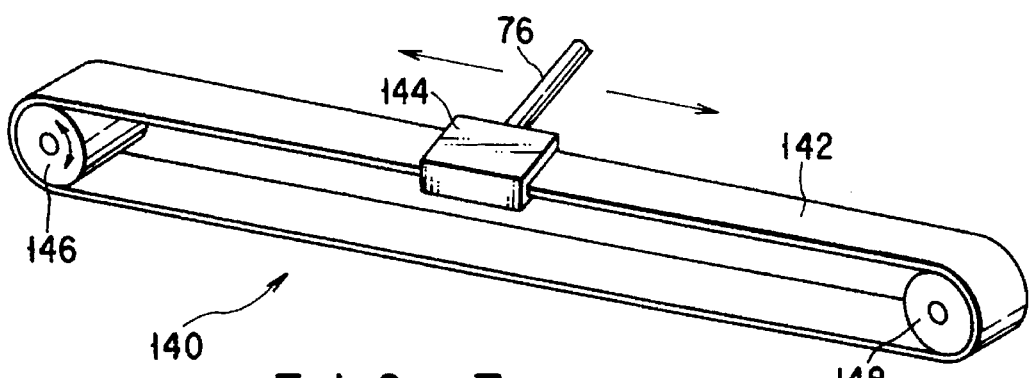
F I G. 7

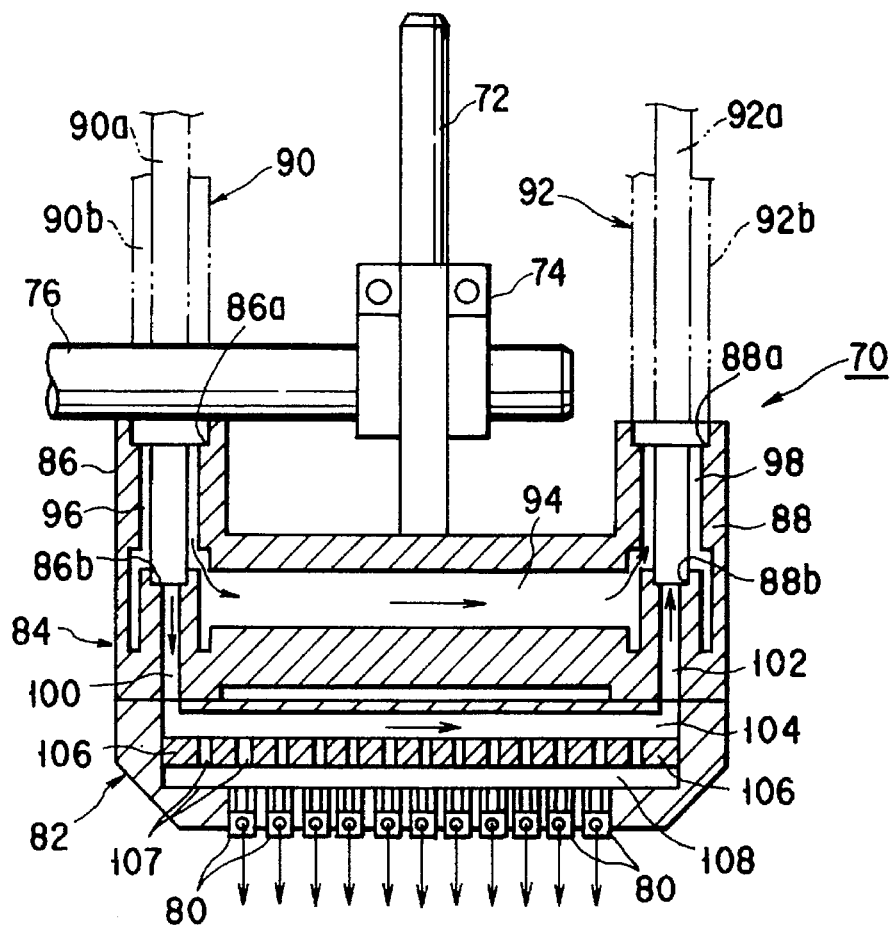
F I G. 10
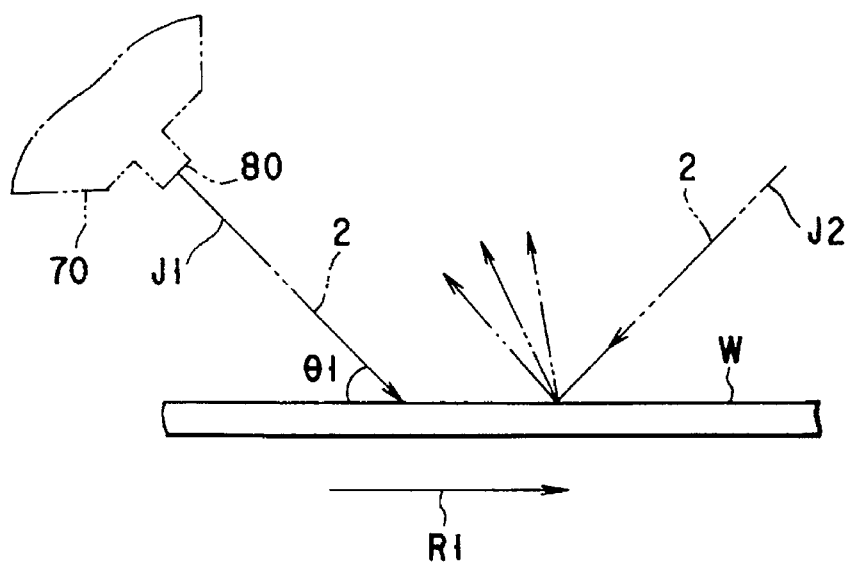
F I G. 13

APPARATUS AND METHOD FOR DEVELOPING RESIST COATED ON A SUBSTRATE

BACKGROUND OF THE INVENTION

1. Field of the Invention

The present invention relates to apparatus and method for developing photoresist on a substrate such as the semiconductor wafer, while supplying developer solution to the substrate which is being spin-rotated.

2. Description of the Related Art

In the photolithography process of making semiconductor devices, photoresist is coated on the semiconductor wafer, pattern-exposed and developed and developer solution is then cleaned and removed. In the developing process, developer solution is supplied on the wafer, which is being spin-rotated, through a nozzle and fully swelled on it due to a surface tension of liquid. In the conventional developing apparatus of the spray type, the nozzle is kept waiting at its home position when it is not used, and when it is to be used, developer solution deteriorated in it is dummy-dispensed at its or other specific position and then sprayed on the wafer through it. In this conventional apparatus, however, developer solution is caused to rush out through it just after the start of supplying, so that developer solution collides with the wafer surface with a big impact. The wafer surface is thus damaged and air bubbles thus caused in developer solution make the development uneven.

U.S. Pat. No. 5,374,312 discloses a developing apparatus in which the nozzle has a plurality of apertures at its solution supply portion and developer solution oozes out through these apertures. In this apparatus, however, developer solution comes from the developed surface of the wafer further onto an undersurface thereof, thereby tainting this undersurface, the spin chuck, the drive motor and others.

SUMMARY OF THE INVENTION

An object of the present invention is therefore to provide apparatus and method enabling the whole of a wafer to be uniformly developed without any uneven development.

Another object of the present invention is to provide apparatus and method not causing the undersurface of a wafer to be tainted by developer solution.

The developing apparatus according to a first embodiment of the present invention comprises a spin chuck for rotating a substrate, while keeping the substrate substantially horizontal, with a resist-coated surface up; a nozzle for supplying developer solution from above and obliquely to the resist-coated surface of the wafer on the spin chuck; a source for supplying the developer solution to the nozzle; a cup having a drain passage enclosing a peripheral portion of the substrate on the spin chuck to drain the developer solution supplied to the substrate; and means for moving the nozzle in a horizontal plane to allow the developer solution to be supplied in a direction that follows the rotating direction of the substrate.

When developer solution 2 is supplied to a substrate W at an angle $\theta_1$, as shown in FIG. 13, a discharging movement vector $J_1$ of the developer solution 2 is directed substantially same as a rotating movement vector $R_1$ of the wafer W, so that the developer solution 2 can follow the movement of the wafer W. It can be thus soft-landed onto the substrate W. When it is supplied with a discharging movement vector $J_2$ reverse to the rotation movement vector $R_1$ of the wafer W, it is hard-landed onto the substrate W, thereby causing a lot of the developer solution 2 to jump up and to disperse from the substrate W and the coated resist film is damaged.

The developing apparatus according to a second embodiment of the present invention comprises a spin chuck for rotating a substrate, while keeping it substantially horizontal, with a resist-coated surface up; a nozzle for supplying developer solution from above and obliquely to the resist-coated surface of the substrate on the spin chuck; a source for supplying the developer solution to the nozzle; a cup having a drain passage enclosing a peripheral portion of the substrate to drain the developer solution supplied to the substrate; means for exhausting the drain passage; a buffer chamber arranged under the substrate on the spin chuck to form a clearance along an undersurface of the substrate; and means for supplying gas into the buffer chamber.

When gas is supplied into the buffer chamber while exhausting the drain passage, gas flow in the buffer chamber from inside to outside thereof is formed at the clearance, thereby preventing the developer solution from coming (or entering along the undersurface of the substrate) onto the undersurface of the substrate at the peripheral portion thereof.

The developing method according to an embodiment of the present invention comprises keeping a substrate substantially horizontal with a resist-coated surface up; spin-rotating the substrate at a first rotation speed, starting the discharging of developer solution through a nozzle at a place so remote as not to cause the developer solution to be supplied on the substrate, while spin-rotating the substrate, and scanning the substrate from above by the nozzle, while keeping the developer solution being discharged through the nozzle; stopping the nozzle just above the center area of the substrate and decreasing the rotation of the substrate from the first to a second rotation speed, and further decreasing the rotation of the substrate from said second rotation speed to a third rotation speed, thereby forming a film of the developer solution on the substrate; spin-rotating the substrate at a fourth rotation speed while stopping the supply of the developer solution to the substrate through the nozzle, thereby removing the developer solution from the substrate by centrifugal force.

The developer solution which rushes out at first through the nozzle when the discharging of the developer solution is started is released at a place so remote as not to cause the solution to be supplied on the substrate. After its discharging becomes stable, it is supplied onto the substrate through the nozzle. This enables impact the developer solution rushed out at first through the nozzle adds to the surface of the substrate to be made smaller. In addition, the developer solution rushed out through the nozzle at the start of its discharging can be caused to drop directly in the cup, thereby enabling it to be collected at a higher efficiency. Further, the substrate can be scanned from above by the nozzle. This enables a more stable discharging of the developer solution to be applied to the whole surface of the substrate which is being rotated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a rear view showing the system;

FIG. 4 is a front view showing the flow of clean air in the system;

FIG. 5 is a side view showing the flow of clean air in the system;

FIG. 6 is a side view, partly sectioned, showing a main portion of the developing apparatus or unit;

FIG. 7 is a perspective view showing a mechanism for driving a developer solution nozzle in a direction of an axis X;

FIG. 10 is a vertically-sectioned view showing the developer solution supply nozzle;

FIG. 13 is intended to explain how the developer solution is supplied to the wafer which is being spin-rotated.

DETAILED DESCRIPTION OF THE PREFERRED EMBODIMENTS

A preferred embodiment of the present invention will be described with reference to the accompanying drawings. The developing apparatus according to an embodiment of the present invention is applied to the resist coating and developing system in this case.

The resist coating and developing system includes a cassette station 10, a process station 12 and an interface section 14. The cassette station 10 has a carrier mechanism for carrying a wafer cassette CR in and out of the system. A lot of 25-sheet of semiconductor wafers W are housed in the wafer cassette CR. The process station 12 includes various kinds of process unit needed for the resist coating and developing process. A wafer W is processed in each of the process units. These process units are stacked one upon the others. The interface section 14 includes a mechanism for transferring the wafer W between a next exposing apparatus (not shown) and the process station 12.

Figure 1:
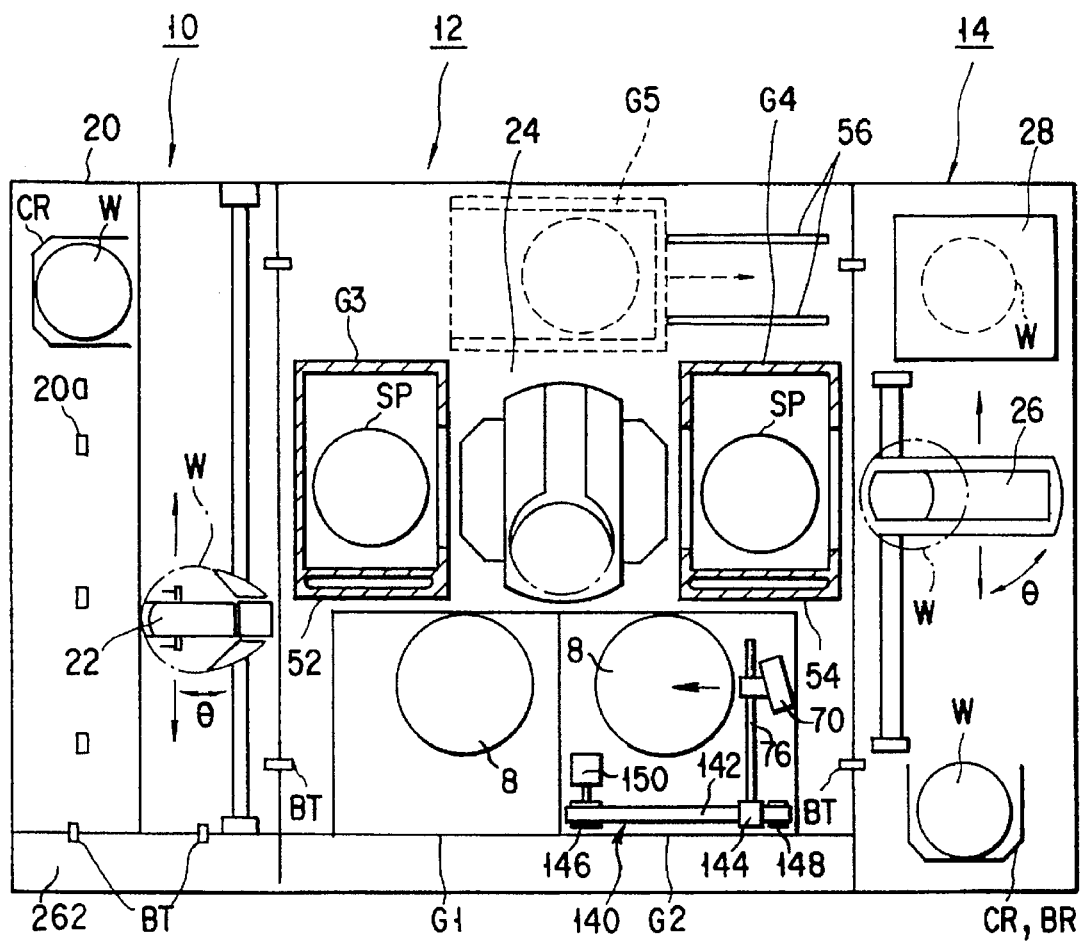
FIG. 1 is a plan view schematically showing the whole of a coating and developing system provided with the developing apparatus according to an embodiment of the present invention.

As shown in FIG. 1, four protrusions 20a are arranged on a cassette-mounted table 20 at the cassette station 10 and the wafer cassette CR is mounted on each of the protrusions 20a. The cassette-mounted table 20 extends in a direction of an axis Y and the wafer cassette CR directs its open side, through which the wafer W is taken in and out, toward the process station 12. A wafer carrying robot 22 can move along the cassette-mounted table 20. It can also move in directions of axes Y and Z and further rotate round a vertical axis by an angle θ. It can gain access to any desired cassette, responsive to a command applied from a controller (not shown). It can also gain access to an alignment unit (ALIM) and an extension unit (EXT) shown in FIG. 3.

Figure 2:
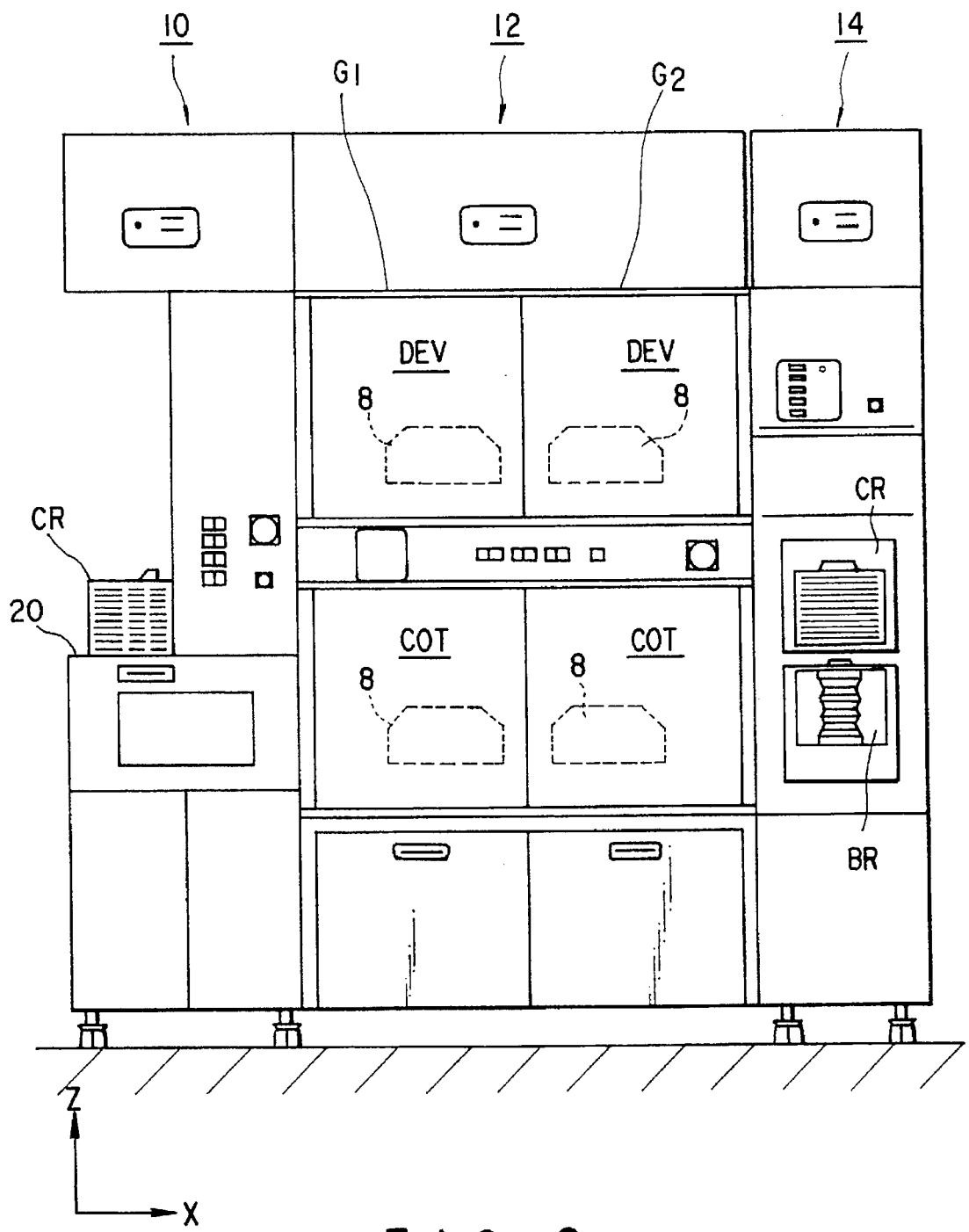
FIG. 2 is a front view showing the system.

As shown in FIG. 1, a main wafer carrier mechanism 24 of the vertical type is arranged in the center of the process station 12. Five sets of unit assemblies G1, G2, G3, G4 and G5 are arranged around the main wafer carrier mechanism 24. Each of the unit assemblies G1, G2, G3, G4 and G5 includes various kinds of process unit. As shown in FIG. 2, first and second unit assemblies G1 and G2 are arranged side by side on the front side of the system. As shown in FIG. 3, the third unit assembly G3 is arranged adjacent to the cassette station 10 and the fourth unit assembly G4 is arranged adjacent to the interface section 14. As shown in FIG. 1, the fifth unit assembly G5 is arranged on the rear side of the system.

As shown in FIG. 2, wafers W mounted on spin chucks 60 are rotated in cups 8 in resist-coating and -developing units (COT) and (DEV) of the first unit assembly G1. The resist coating unit (COT) is arranged under the resist developing unit (DEV). Similarly in the second unit assembly G2, the resist coating unit (COT) is arranged under the resist developing unit (DEV).

As shown in FIG. 3, the third unit assembly G3 includes cooling (COL), adhesion (AD), alignment (ALIM), extension (EXT), pre-baking (PREBAKE) and post-baking (POBAKE) units stacked one upon the others from the below in this order in eight steps. Similarly, the fourth unit assembly G4 includes cooling (COL), extension and cooling (EXTCOL), extension (EXT), cooling (COL), pre-baking (PREBAKE) and post-baking (POBAKE) units stacked same as in the third unit assembly G3.

When the cooling (COL) and extension/cooling (EXTCOL) units in which process temperature is low are arranged, as lower steps, in lower portion of the system, while arranging the pre-baking (PREBAKE), post-baking (POBAKE) and adhesion (AD) units, in which process temperature is high, as higher steps, in higher portion of the system, thermal interference between the units can be made less.

The interface section 14 has in the Y axis direction a size substantially same as but in the X axis direction a size smaller than that of the process station 12. A pickup cassette CR of the carry type and a buffer cassette BR of the stationary type are arranged one upon the other on the front side of the interface section 14. A peripheral exposing unit 28 is arranged on the rear side thereof and a wafer carrying robot 26 in the center thereof. The robot 26 can move in Y and Z axes directions to gain access to both of the cassettes CR and BR and to the peripheral exposing unit 28. It can also move round the vertical axis by an angle θ to gain access to the extension unit (EXT) of the process station 12 and to the wafer-transfer mechanism (not shown) of the exposure apparatus.

This system is arranged in a clean room and cleanness in each unit section in the system is also enhanced by the efficient vertical laminar flow of air. As shown in FIGS. 4 and 5, down-flow of clean air is caused in the system.

In FIGS. 4 and 5, air supply chambers 12a, 14a and 16a are arranged on the cassette and process stations 10 and 12 and the interface section 14, and dust-proof filters such as ULPA ones 30, 32 and 34 are attached to the undersides of the air supply chambers 12a, 14a and 16a.

As shown in FIG. 5, an ammonia eliminator 35 and an air conditioner 36 is arranged outside or behind the process system. Air is introduced from the air conditioner 36 via the ammonia eliminator 35 into the air supply chambers 12a, 14a and 16a through a pipe 38 and it is then cleaned by the ULPA filters 30, 32 and 34 in them. This clean air is supplied, as down flow, to the unit sections 10, 12 and 14, collected in an exhaust opening 42 on the bottom of the system, passing through a ventilation hole 40, and returned from the exhaust opening 42 into the ammonia eliminator 35 and the air conditioner 36 through a pipe 44. Air may be exhausted outside through the exhaust opening 42, without being circulated.

As shown in FIG. 4, a space above the cassette-mounted table 20 and another space in which the wafer carrier robot or arm 22 moves are partitioned in the cassette station 10 by a partition plate 11 of the hanging wall type and air flows, as down flow, in them differently.

As shown in FIGS. 4 and 5, a ULPA filter 46 is arranged on the ceiling of the lower resist coating units (COT) and (COT) of the first and second unit assemblies G1 and G2 in the process station 12, and air is supplied from the air conditioner 36 to the filter 46, passing through the pipe 38 and then a pipe 48 branching from the pipe 38. A temperature and moisture adjuster (not shown) is arranged in the way of the pipe 48 to supply clean air, which has a predetermined temperature and moisture suitable for the resist coating process, to the resist coating units (COT) and (COT). A temperature and moisture sensor 50 is also arranged on the air-blowing side of the filter 46 to send output to a control section for the temperature and moisture adjuster. Responsive to the output applied from the sensor 50, the control section causes the temperature and moisture adjuster to control the temperature and moisture of clean air to appropriate ones.

In FIG. 4, an opening DR through which the wafer and the carrier arm are carried in and out is provided in that side wall of each of the spinner type process units which is opposed to the main wafer carrier mechanism 24. A shutter (not shown) is attached to each of the openings DR to prevent particles and contaminations from entering from each unit into the side of the main wafer carrier mechanism 24.

The wafer W is carried and processed in each of the units, as described below, in the above-described resist coating and developing system.

Silicon wafers W are taken one by one out of the wafer cassette CR and carried into the alignment unit (ALIM) by the wafer carrier 22. The wafer W aligned here is carried into the adhesion unit (AD) by the robot 24 and then adhesion-processed there. After the adhesion process is finished, the wafer W is carried into the cooling unit (COL) by the main wafer carrier mechanism 24 and then cooled there. Thereafter, it is processed in the resist coating (COT), pre-baking (PREBAKE), extension and cooling(EXTCOL) and exposing units through the interface section 14. It is then processed in the extension (EXT), developing (DEV) and post-baking (POBAKE) units of the fourth unit assembly G4 and further in the extension unit (EXT) of the third unit assembly G3. The wafer W thus processed is finally returned to the cassette CR.

The developing unit (DEV) will be described referring to FIGS. 6 through 10.

As shown in FIG. 6, a cylindrical cup 8 is arranged in the developing unit (DEV) and a spin chuck 60 is arranged inside the ring-shaped cup 8 in the center thereof. The wafer W is carried into the unit (DEV) and mounted on the spin chuck 60 by the robot 24. The spin chuck 60 holds the wafer W, using vacuum suction, and it is rotated by a drive motor 62. A power supply for the motor 62 is connected to the output side of a controller (not shown) and its rotation number is thus controlled depending upon conditions under which the wafer W is processed. Waste liquid and gas caused in the cup 8 are exhausted into a trap tank (not shown) through a drain passage 69, which is communicated with the pumping side of an exhaust pump 170.

A ring member 66 is attached to the top of an inner side wall 64 of the cup 8 and a small clearance 67 is provided between the ring member 66 and the underside of the wafer W. A cylindrical bottomed box 68 is attached to an inner vertical side of the ring member 66, enclosing the spin chuck 60, to thereby form a buffer chamber 65. One or plural gas inlets 68a are formed in the bottom of the box 68 and gas is thus introduced from a gas supply source 160 into the buffer chamber 65 through the gas inlets 68a. $N_2$ gas or clean air is stored in the gas supply source 160. Gas introduced into the buffer chamber 65 flows into the drain passage 69 through the narrow clearance 67. Air or gas current flowing along the undersurface of the wafer at the peripheral portion thereof and from the center to the periphery thereof is formed in this manner.

As shown in FIG. 1, a developer solution supply nozzle 70 is arranged in the developing unit (DEV) of the second unit assembly G2. It can move in the Y axis direction and it is made of fluorine resin, excellent in corrosion proof and difficult to cause particles.

As shown in FIG. 6, the nozzle 70 is supported by a horizontal arm 76 through a vertical support rod 72 and a joint member 74. As shown in FIG. 7, the horizontal arm 76 is connected to a block 144 of a belt drive mechanism 140 and the block 144 is fixed to a belt 142, which is stretched between a pair of pulleys 146 and 148, and the drive pulley 146 is connected to a rotation shaft of a motor 150. When the motor 150 is driven and rotated, the nozzle 70 is moved like a line in the X axis direction by the belt drive mechanism 140. The moving stroke of the nozzle 70 ranges from the outer position (or home position) of the cup 8 to the center portion (or solution-swelling position) thereof.

As shown in FIG. 10, the nozzle 70 has a bottom (or solution discharging) portion 82 formed like a line and provided with a plurality of solution discharging apertures 80, which are arranged in a line. Their pitch is about 6 mm and their diameter is about 1.8 mm. The length of the linear bottom portion 82 is about 42 mm for 6-inch wafers, about 60 mm for 8-inch wafers, and about 84 mm for 12-inch wafers. It is preferable that the length of solution discharging apertures arranged in a line is in a range of 1/5 to 1/2 of wafer diameter.

Passages of two types are formed in the nozzle 70. The first type passage 100, 102 and 104 is communicated with a developer solution supply source 165 through inner pipes 90a and 92a to enable developer solution 2 to flow through them. The second type passage 94, 96 and 98 is communicated with a temperature adjusting water supply source (not shown) through outer pipes 90b and 92b to enable temperature-adjusted water to flow through them. The solution discharging portion 82 and a temperature adjusting section 84 may be made of metal such as stainless steel or aluminium.

A pair of cylindrical pipe junctions 86 and 88 are projected from both ends of that rear side of the nozzle 70 which is opposed to the temperature adjusting section 84 when viewed from the solution discharging portion 82 of the nozzle 70. A pair of double pipes 90 and 92 which comprise inner pipes 90a, 92a and outer pipes 90b, 92b are connected to the pipe junctions 86 and 88. The outer pipes 90a and 92a are attached to temperature adjusting water ports 86a and 88a which are adjacent to open ends of the pipe junctions 86 and 88, having a relatively larger diameter. The inner pipes 90b and 92b are attached to developer solution ports 86b and 88b of the junctions 86 and 88.

The temperature adjusting water passage 94 in the temperature adjusting section 84 extends parallel to the line of nozzle apertures 80. It is communicated with the developer solution supply pipe 90 through the passage 96 round the developer solution port 86b and through the ports 86b and 86a. It is also communicated with the developer solution pipe 92 through the passage 98 round the developer solution port 88b and through the ports 88b and 88a. Temperature adjusting water is introduced from the pipe 90 to the port 88a through the passage 96, 94 and 98 and returned to the temperature adjusting water supply source through the other pipe 92.

The passage 104 in the solution discharging portion 82 is communicated with the developer solution ports 86b and 88b through the passages 100 and 102. A straightening vane or plate 106 forms the bottom of the passage 104 and it has a plurality of holes 107 communicated with a solution reservoir 108, which is communicated with the solution discharging apertures 80. After being introduced into the passage 104, a part of developer solution 2 is passed into the solution reservoir 108 through the holes 107 of the straightening plate 106 and discharged through the apertures 80, while the other part of it is returned to the developer solution supply source 165 through the inner pipe 92a.

The developer solution 2 supplied to the nozzle 70 is kept certain in temperature in the pipe 90a and the discharging section 82 by the temperature adjusting pipe and section 90b and 84. It can be therefore kept excellent in state when it is discharged through the apertures 80.

As shown in FIGS. 13, 6 and 10, the solution discharging apertures 80 of the nozzle 70 are directed obliquely downward in such a way that the developer solution 2 can be discharged to the wafer W through the apertures 80 by an angle of $\theta_1$. The angle $\theta_1$ is set to be about 45° in this case.

Figure 8:
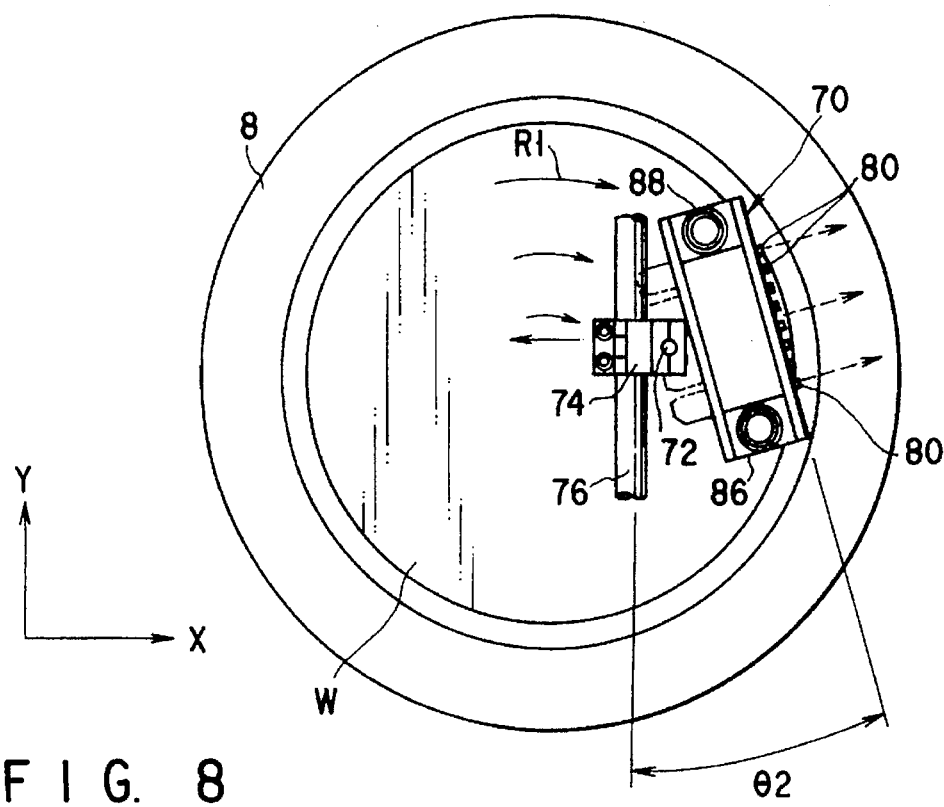
FIG. 8 is a plan view showing how the nozzle is positioned relative to a wafer when the discharging of the developer solution is started.
Figure 9:
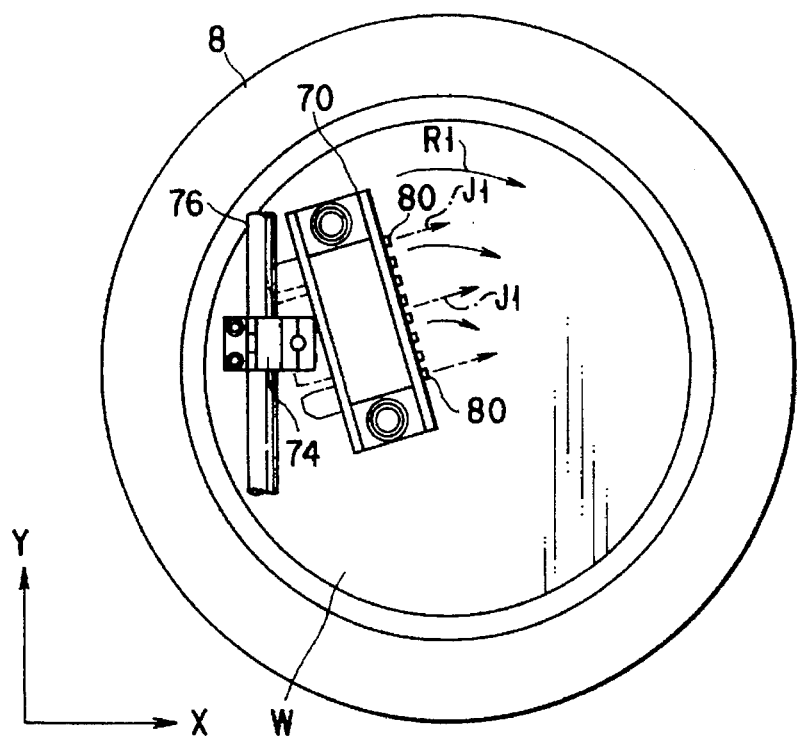
FIG. 9 is a plan view showing how the nozzle is positioned relative to the wafer when the scanning of the nozzle relative to the wafer is finished.
Figure 11:
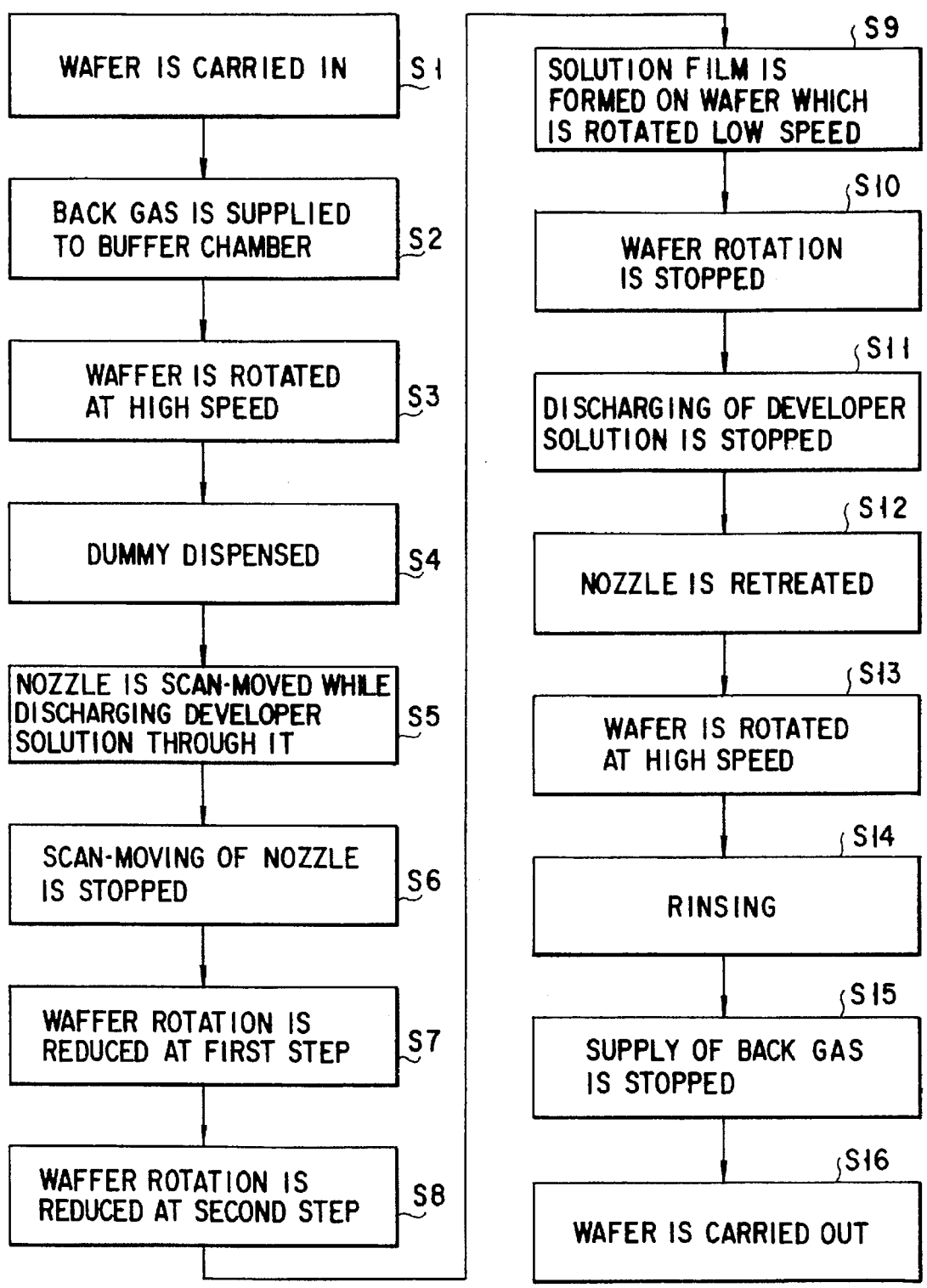
FIG. 11 is a flow chart showing the developing method according to an embodiment of the present invention.

As shown in FIGS. 8 and 9, the nozzle 70 is not parallel to the horizontal arm 76 but it is attached to the arm 76 at an angle of $\theta_2$ when viewed in a plane. The line of discharging apertures 80 is thus tilted relative to the axis Y by the angle $\theta_2$. The angle $\theta_2$ is set to be about 10° in this case. It is preferable that the angle $\theta_2$ is in a range of 5° to 20°.

The developing process will be described referring to FIGS. 11, 12A to 12F and 13.

Figure 12A:
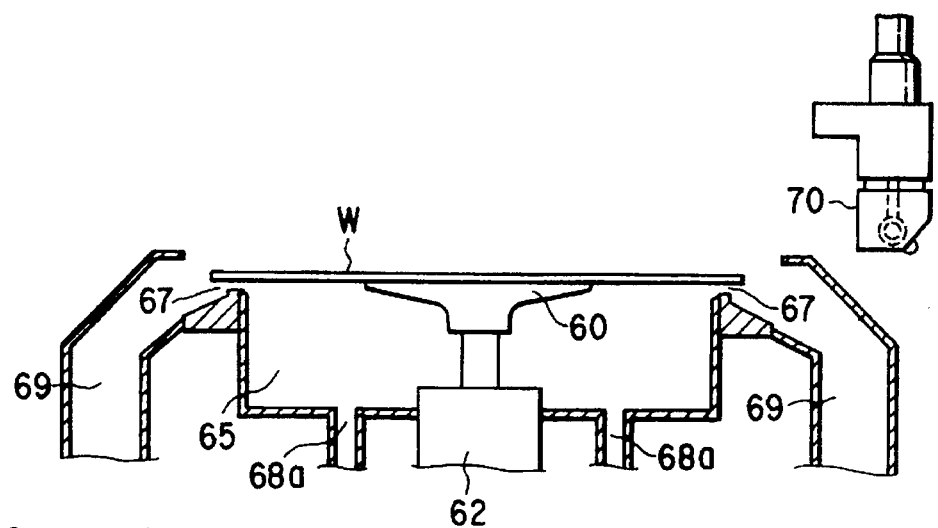
FIGS. 12A through 12F are vertically-sectioned side views showing a series of developing processes or steps of the method.

An 8-inch silicon wafer W is coated with photoresist, baked and then pattern-exposed. It is carried out of the exposing unit (not shown) and into the developing unit (DEV) (step S1). It is vacuum-attracted and held by the spin chuck 60, as shown in FIG. 12A. The nozzle 70 is at its home position this time.

The cup 8 is exhausted through the drain passage 69 while $N_2$ gas is supplied to the buffer chamber 65 through the passages 68a (step S2). $N_2$ gas current flowing from the buffer chamber 65 into the passage 69 through the clearance 67 is thus provided. This gas current flows through the clearance 67 from inside to outside, thereby preventing the developer solution 2 from coming from the top surface of the wafer W onto the undersurface thereof at the peripheral portion thereof. The gas current flows, due to orifice effect, particularly at the clearance 67 at a higher speed. The developer solution 2 can be thus fully prevented from coming onto the undersurface of the wafer W. The wafer W is rotated at a high speed of about 1000 rpm by the spin chuck 60 (step S3).

Figure 12B:
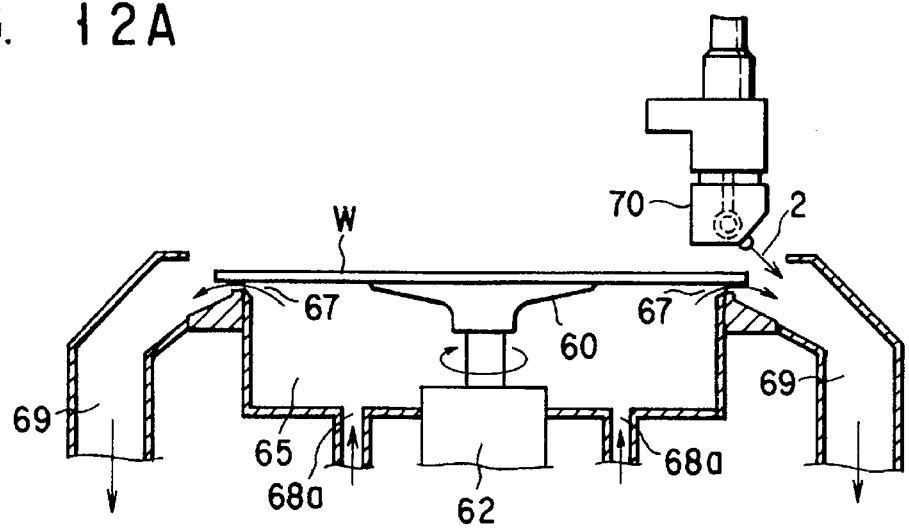

The nozzle 70 is moved from its home position to just above the open top of the drain passage 69, as shown in FIG. 12B, and the developer solution 2 is dummy-dispensed into the drain passage 69 for about 0.5 seconds (step S4).

Figure 12C:
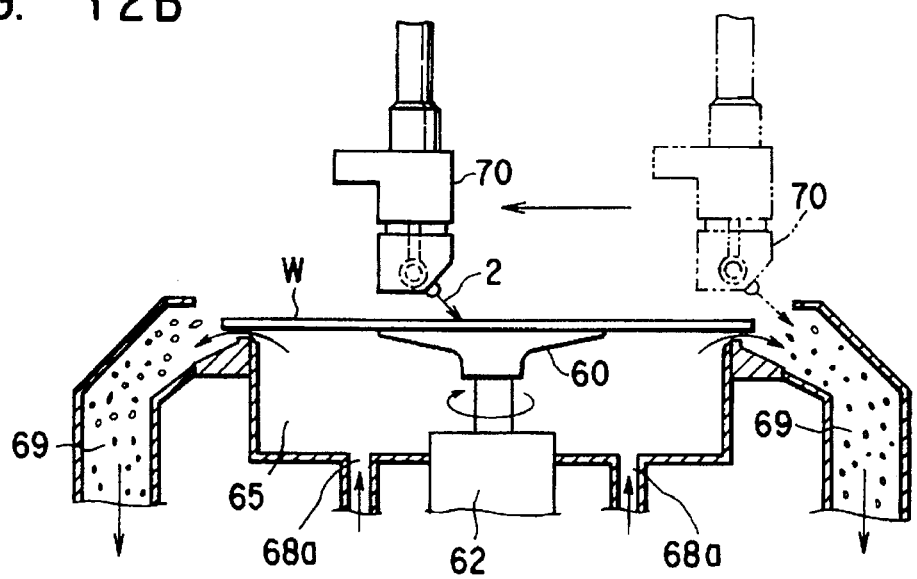

As shown in FIGS. 12C and 8, discharging the developer solution, the nozzle 70 is moved to scan the wafer W which is being rotated at high speed (step S5). The scanning speed of the nozzle 70 is in a range of 60 to 100 mm per second. This area of the wafer W scanned by the nozzle 70 depends upon the number of apertures 80 and their pitch and it is usually set to be about ¼ of the wafer area. It is preferable in this case that the nozzle 70 scans the wafer W with its line of apertures 80 kept substantially perpendicular to the rotating direction of the wafer W. The nozzle 70 continues to discharge the developer solution 2 through it from the step S4 to the step S9. It is preferable that a clearance between the nozzle 70 and the wafer W is set to be in a range of 2 to 10 mm, more preferably in a range of 2 to 4 mm.

When the developer solution 2 is discharged to the wafer W at the angle $\theta_1$, as shown in FIG. 13, its movement vector $J_1$ is directed same as the rotation movement vector $R_1 1$ of the wafer W, thereby allowing it to follow the movement of the wafer W. This enables it not to jump against the wafer W but to soft-land on it.

When the developer solution 2 is supplied with its movement vector $J_2$ kept reverse to the rotation movement $R_1$ of the wafer W, it is caused to hard-land on the wafer W, thereby causing a large amount of the solution 2 to be splashed by the wafer W, and the coated resist film is damaged. Even when the angle $\theta_1$ at which it is discharged is set to be 90°, its splashing is also similarly caused. It is preferable in this case that its discharged angle $\theta_1$ is in a range of 30° to 60° when the rotation speed of the wafer W is 30 rpm, more preferably at 45°. It is also preferable that its discharged angle $\theta_1$ is made smaller than 45° when the wafer rotation speed becomes higher than 30 rpm, more preferably in a range of 15° to 45°.

As shown in FIG. 9, the nozzle 70 is stopped at such a position that its innermost aperture 80 comes over the wafer rotation shaft (step S6). More specifically, it is stopped with its second aperture 80, which is next to the innermost one, aligned with the wafer rotation shaft. When it is positioned relative to the wafer W in this manner, the developer solution 2 can be uniformly supplied to the whole surface of the wafer W without being insufficiently supplied to the center area of the wafer W. The scanning time by the nozzle 70 is about 1 second. While the scanning is being done by the nozzle 70, the wafer W is wetted with the developer solution 2, without generating any bubbles in the developer solution 2.

After the nozzle 70 is stopped, the rotation number of the spin chuck 60 is reduced from 1000 rpm to 100 rpm to rotate the wafer W at a lower speed (step S7). It is further reduced from 100 rpm to 30 rpm (step S8). The rotation number decreasing time is about 1.5 seconds at the first decreasing rotation step and about 2 seconds at the second decreasing rotation step. The reason why the wafer rotation speed is decreased step by step from the step S6 to the step S8 resides in that the developer solution gathers too much in the center area of the wafer W to thereby make its film thickness on the wafer W uneven when the wafer rotation speed is decreased rapidly from 1000 rpm to 30 rpm.

Figure 12D:
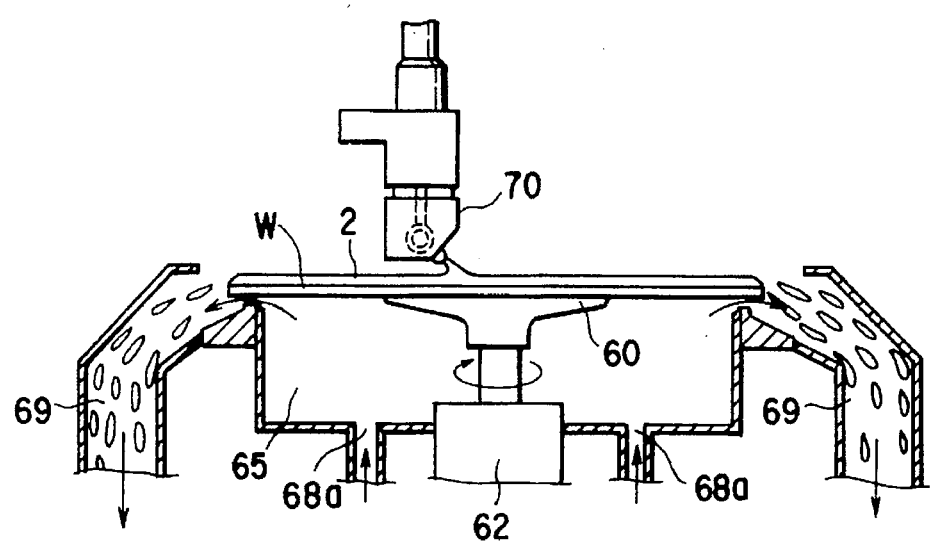

When the wafer rotation speed is kept to be 30 rpm, the amount of the developer solution supplied to the wafer W is balanced with its amount shaken off from the wafer W, as shown in FIG. 12D, thereby enabling its thin film to be formed on the wafer W (step S9). The rotation of the wafer W is stopped (step S10). The thin film is held on the wafer W for about 5 seconds and the coated resist is thus developed.

Figure 12E:
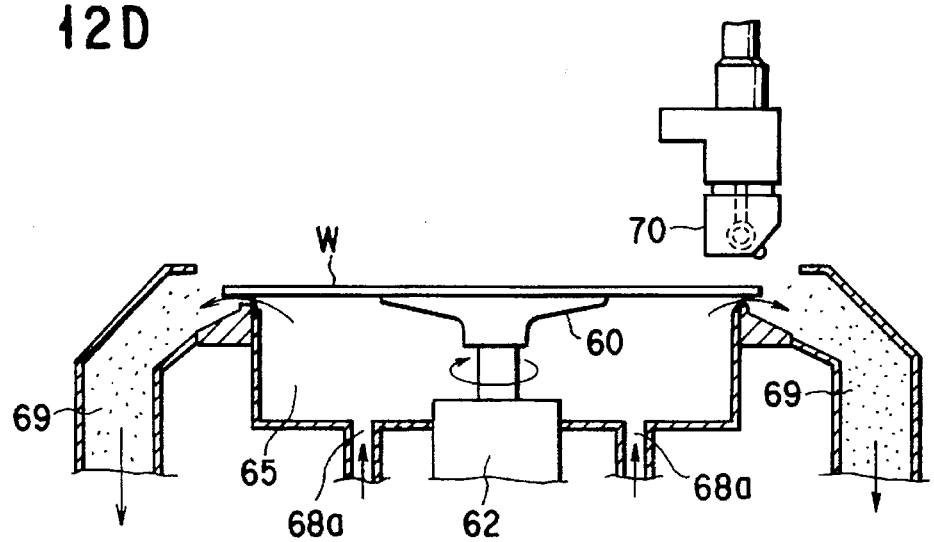

As shown in FIG. 12E, the discharging of the developer through the nozzle 70 is stopped (step S11), the nozzle 70 is retreated to its dummy-dispensing position and then to its home position (step S12).

Figure 12F:
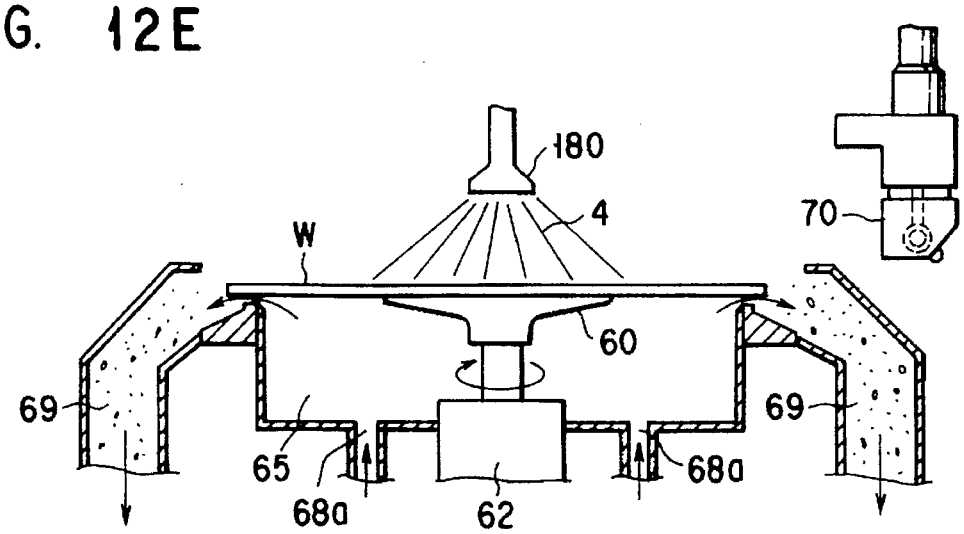

The wafer rotation speed is raised instantly from 30 rpm to 1000 rpm to rotate the wafer W at high speed, as shown in FIG. 12F (step S13). A rinse nozzle 180 is positioned above the wafer W and cleaning solution 4 is sprayed on the wafer W for a certain time period to completely remove the developer solution 2 from the wafer W (step S14).

After this rinsing, the wafer W is stopped and the supply of back gas into the buffer chamber 65 is also stopped, while keeping the drain passage 69 being exhausted (step S15). The wafer W is released from the spin chuck and carried out of the developing unit (DEV) (step S16). One cycle process time starting from the step S1 and ending with the step S16 is about 15 seconds.

According to the above-described embodiment of the present invention, the discharging of developer solution through the nozzle 70 is started immediately before the nozzle 70 is moved just above the wafer W. The developer solution 2 can be thus more stably discharged through the nozzle 70 from the time when the nozzle 70 is started for scanning. This enables the developer solution 2 to be more uniformly supplied to the whole surface of the wafer W.

According to the present invention, developer solution which is rushed out at first through the nozzle at the start of solution discharge is not directed to the substrate but to the other position or into the drain passage, and when the solution discharge becomes stable, the developer solution is then supplied onto the substrate through the nozzle. Impact added to the surface of the substrate by the developer solution discharged at first can be thus made smaller. In addition, the developer solution rushed out at first can be dropped directly into the cup and more efficiently collected by it. Further, the substrate is scanned by the nozzle, thereby enabling the developer solution to be more stably supplied to the whole surface of the wafer which is being rotated.

When developer solution is discharged to the substrate at the angle of $\theta_1$, its movement vector $J_1$ of is directed substantially same as the rotation movement vector $R_1$ of the wafer W, thereby allowing it to follow the movement of the substrate. It can be thus soft-landed on the substrate not to damage the surface thereof and not to generate any air bubbles in it.

Still further, air current flowing through the clearance 67 advances from inside to outside along the underside of the wafer at the outer rim portion thereof. Developer solution can be thus prevented from coming onto the underside of the wafer to taint it and the spin chuck 60.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An apparatus for developing photoresist coated on a substrate comprising:

a spin chuck for rotating the substrate while keeping the substrate substantially horizontal with a resist-coated surface up;

a nozzle having a linear array of a plurality of solution discharging apertures for supplying a developer solution obliquely downward from said solution discharging apertures to the resist-coated surface of the substrate on the spin chuck;

a source for supplying the developer solution to the nozzle;

a cup arranged to enclose a peripheral portion of the substrate on the spin chuck and having a drain passage through which the developer solution supplied to the substrate is discharged and drained; and means for moving the nozzle in a horizontal plane to allow the developer solution to be discharged in the direction in which the substrate is rotated, thereby permitting the developer solution to be supplied straight from said solution discharging apertures toward the substrate and also permitting the supplied developer solution to land on the substrate without being splashed on the substrate.

2. The developing apparatus according to claim 1, wherein the developer solution is discharged to the horizontal plane at an angle of 30° to 60° through the solution discharging apertures.

3. The developing apparatus according to claim 1, wherein the developer solution is discharged to the horizontal plane at an angle of 15° to 45° through the solution discharging apertures.

4. The developing apparatus according to claim 1, wherein the nozzle moving means has a horizontal arm extending in the direction of an axis Y to support the nozzle, and a drive mechanism for linearly moving the horizontal arm in the Y axis direction in the horizontal plane.

5. The developing apparatus according to claim 4, wherein an array of said apertures is positioned relative to the horizontal arm in the horizontal plane at an angle of 10°±5°.

6. The developing apparatus according to claim 1, wherein the nozzle moving means has a belt drive mechanism for linearly moving the nozzle in the horizontal plane.

7. The developing apparatus according to claim 1, wherein a length of an array of said solution discharging apertures is ⅕ to ½ of the diameter of the substrate.

8. The developing apparatus according to claim 1, further comprising means for supplying back gas to the undersurface of the substrate on the spin chuck.

9. The developing apparatus according to claim 1, further comprising exhaust means communicated with the drain passage of the cup to forcedly exhaust the cup.

10. An apparatus for developing photoresist coated on a substrate comprising, spin chuck for rotating the substrate while keeping the substrate substantially horizontal with a resist-coated surface up;

a nozzle for supplying developer solution to the resist-coated surface of the substrate on the spin chuck;

a source for supplying the developer solution to the nozzle;

a cup arranged enclosing a peripheral portion of the substrate on the spin chuck and having a drain passage through which the developer solution supplied to the substrate is drained;

means for exhausting the drain passage;

a buffer chamber arranged under the substrate on the spin chuck to form a clearance relative to an undersurface of the substrate at the peripheral portion thereof; and means for supplying gas into the buffer chamber;

wherein when gas is supplied into the buffer chamber while exhausting the drain passage, a gas flow is formed at the clearance, from inside to outside along the undersurface of the substrate, thereby preventing the developer solution from spreading onto the undersurface of the substrate at the peripheral portion thereof.

11. The developing apparatus according to claim 10, wherein the drain passage has an open top into which the developer solution is dummy-dispensed through the nozzle.

12. The developing apparatus according to claim 10, wherein the nozzle has apertures through which the developer solution is discharged, from above and obliquely, to the resist-coated surface of the substrate.

13. The developing apparatus according to claim 10, further comprising a horizontal arm extending in the direction of an axis Y to support the nozzle and a drive mechanism for linearly moving the horizontal arm in the direction of an axis X in a horizontal plane.

14. A method of developing photoresist coated on a substrate comprising the steps of (a) holding the substrate substantially horizontal, with a resist-coated surface up;

(b) spin-rotating the substrate at a first rotation speed, starting the discharging of developer solution through a nozzle at a position so remote as not to spray the solution on the substrate while spin-rotating the substrate in this manner, and scan-moving the nozzle above the substrate while discharging the developer solution through the nozzle;

(c) stopping the nozzle just above the center portion of the substrate while decreasing the rotation of the substrate from the first rotation speed to a second rotation speed, and further decreasing the rotation of the substrate from said second rotation speed to a third rotation speed, thereby forming a film of the developer solution on the substrate; and (d) spin-rotating the substrate at a fourth rotation speed while stopping the supply of developer solution to the substrate through the nozzle, thereby removing the developer solution from the substrate by centrifugal force.

15. The developing method according to claim 14, wherein a clearance between the nozzle and the substrate is set to be in a range of 2 to 10 mm at the scan-moving step (b) and the solution film forming step (c).

16. The developing method according to claim 14, wherein the developer solution rushed out through the nozzle at the start of the scan-moving step (b) is received directly in a drain passage of a cup.

17. The developing method according to claim 14, wherein the nozzle discharges the developer solution to the resist-coated surface of the substrate at an angle of 30° to 60°.

18. The developing method according to claim 14, wherein the nozzle discharges the developer solution to the resist-coated surface of the substrate at an angle of 15° to 45°.

19. The developing method according to claim 14, further comprising the steps of, preparing a nozzle having a plurality of solution discharging apertures linearly arranged in a line; and positioning the nozzle above the substrate in such a way that an array of said apertures is substantially along the radial direction of the substrate to form a solution film on the substrate.

20. The developing method according to claim 19, wherein a second solution discharging aperture which is next to the innermost one in the line of the apertures is aligned with the rotating shaft of the substrate.

21. The developing method according to claim 14, wherein the rotation of the substrate is stopped after rotating the substrate at the third rotation speed in the solution film forming step (c).

22. The developing method according to claim 14, where the first rotation speed is 1000±2 rpm, and the second rotation speed is 100±0.5 rpm, and the third rotation speed is 30±0.5 rpm, and the fourth rotation speed is 1000±2 rpm.

23. The developing method according to claim 14, wherein the discharge of the developing solution through the nozzle in step (b) is started at a position so remote as not to spray the solution onto the substrate and with discharge of the developing solution started in a direction away from the substrate.

* * * * *